(12) United States Patent
Cha

(10) Patent No.: US 9,093,173 B1
(45) Date of Patent: Jul. 28, 2015

(54) SEMICONDUCTOR MEMORY APPARATUS

(71) Applicant: SK hynix Inc., Icheon-si Gyeonggi-do (KR)

(72) Inventor: Jae Hoon Cha, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/329,365

(22) Filed: Jul. 11, 2014

(30) Foreign Application Priority Data

Mar. 27, 2014  (KR) .......................... 10-2014-0036218

(51) Int. Cl.
*G11C 11/406*  (2006.01)
*G11C 11/408*  (2006.01)

(52) U.S. Cl.
CPC .......... *G11C 11/406* (2013.01); *G11C 11/4087* (2013.01)

(58) Field of Classification Search
CPC ................. G11C 11/40487; G11C 11/406
USPC ........................................................ 365/222
See application file for complete search history.

(56) References Cited

U.S. PATENT DOCUMENTS

| 6,256,244 | B1 * | 7/2001 | Kim ............................... 365/203 |
| 6,307,410 | B1 * | 10/2001 | Matsui ........................... 327/154 |
| 2001/0049807 | A1 * | 12/2001 | Kim ............................... 714/743 |
| 2009/0100231 | A1 * | 4/2009 | Okabayashi et al. ......... 711/137 |

FOREIGN PATENT DOCUMENTS

KR    1020130115066 A    10/2013

* cited by examiner

*Primary Examiner* — Vanthu Nguyen
*Assistant Examiner* — Khamdan Alrobaie
(74) *Attorney, Agent, or Firm* — William Park & Associates Ltd.

(57) ABSTRACT

A semiconductor memory apparatus may include a refresh counting portion configured to count the number of times a refresh signal is received by the refresh counting portion, and configured to generate a smart refresh enable signal when the number of times the refresh signal is received by the refresh counting portion reaches a predetermined number and an address arithmetic portion configured to latch an address, and, when the smart refresh enable signal is enabled, configured to perform an arithmetic operation of addition and subtraction on the latched address and output a result of the arithmetic operation as an arithmetic address. The semiconductor memory apparatus may also include an address selection portion configured to output one of the arithmetic addresses and one of the addresses as a selection address in response to the smart refresh enable signal.

14 Claims, 6 Drawing Sheets

SEMICONDUCTOR MEMORY APPARATUS

CROSS-REFERENCES TO RELATED APPLICATION

The present application claims priority under 35 U.S.C. §119(a) to Korean application number 10-2014-0036218, filed on Mar. 27, 2014, in the Korean Intellectual Property Office, which is incorporated herein by reference in its entirety as set forth in full.

BACKGROUND

1. Technical Field

Various embodiments generally relate to a semiconductor integrated circuit, and more particularly, to a semiconductor memory apparatus.

2. Related Art

A semiconductor memory apparatus may be configured to store data using the charge accumulation of a capacitor. The value associated with data stored in a memory cell is identified according to an amount of charge accumulation within the capacitor of the memory cell.

The amount of charge accumulation may decrease as time goes by. This decrease is due to a leakage current. Thus, to help compensate for the leakage the charges are re-accumulated in the capacitor at predetermined times. This process of re-accumulating the charges in the capacitor can be referred to as a refresh operation.

As the integration of the semiconductor memory apparatus increases the distances between the signal lines and between the memory cells of the semiconductor memory apparatus become narrower. As a result, data stored in the memory cells coupled with frequently activated word lines may be damaged due to the refresh operation. Additionally, data stored in the memory cells that are adjacent to word lines that are adjacent to the frequently activated word lines may also be damaged due to the refresh operation as well.

SUMMARY

In an embodiment, a semiconductor memory apparatus may include a refresh counting portion configured to count the number of times a refresh signal is received by the refresh counting portion, and configured to generate a smart refresh enable signal when the number of times the refresh signal is received by the refresh counting portion reaches a predetermined number. The semiconductor memory apparatus may also include an address arithmetic portion configured to latch an address, and when the smart refresh enable signal is enabled, configured to perform an arithmetic operation of addition and subtraction on the latched address and output a result of the arithmetic operation as an arithmetic address. The semiconductor memory apparatus may also include an address selection portion configured to output one of the arithmetic addresses and one of the addresses as a selection address in response to the smart refresh enable signal.

In an embodiment, a semiconductor memory apparatus may include a refresh counting portion configured to enable a smart refresh enable signal when a refresh signal is enabled a predetermined number of times, and an address arithmetic portion configured to respectively latch an address according to a bank address. The semiconductor memory apparatus may also include in response to the smart refresh enable signal, configured to perform an arithmetic operation of addition and subtraction on the latched address and sequentially output a result of the arithmetic operation as an arithmetic address. The semiconductor memory apparatus may further include an address selection portion configured to output one of the arithmetic addresses and one of the addresses as a selection address in response to the smart refresh enable signal.

DETAILED DESCRIPTION

Hereinafter, a semiconductor apparatus will be described below with reference to the accompanying drawings through various examples of embodiments.

Figure 1:
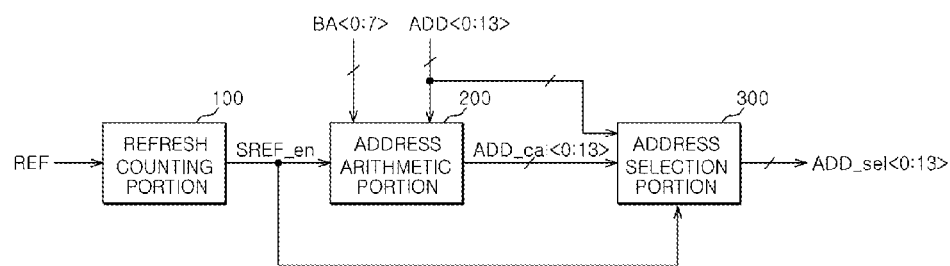
FIG. 1 is a block diagram representation of an embodiment of a semiconductor memory apparatus.

Referring to FIG. 1, the semiconductor memory apparatus in accordance with an embodiment may include a refresh counting portion 100, and an address arithmetic portion 200. The semiconductor memory apparatus may also include an address selection portion 300.

The refresh counting portion 100 may count the number of times a refresh signal REF is enabled. The refresh counting portion 100 may count the number of times the refresh signal REF is inputted into the refresh counting portion 100 or received by the refresh counting portion 100. The refresh counting portion 100 may generate a smart refresh enable signal SREF_en when the number of times the refresh signal REF is enabled reaches a predetermined number. For example, the refresh counting portion 100 may enable the smart refresh enable signal SREF_en after the refresh signal REF has been enabled 8 times, etc.

The address arithmetic portion 200 may latch an address ADD<0:13> according to a bank address BA<0:7>. The address arithmetic portion 200 may perform the arithmetic operation of addition and subtraction on the latched address ADD<0:13>, and output the address ADD<0:13>, on which the arithmetic operation of addition and subtraction is performed. The address arithmetic portion 200 may output the address ADD<0:13>, on which the arithmetic operation of addition and subtraction is performed, as an arithmetic address ADD_cal<0:13> when the smart refresh enable signal SREF_en is enabled. The address ADD<0:13> may be, for example, an address of a row, etc.

In response to the smart refresh enable signal SREF_en, the address selection portion 300 may output one of the addresses ADD<0:13> and one of the arithmetic addresses ADD_cal<0:13> as a selection address ADD_sel<0:13>.

Figure 2:
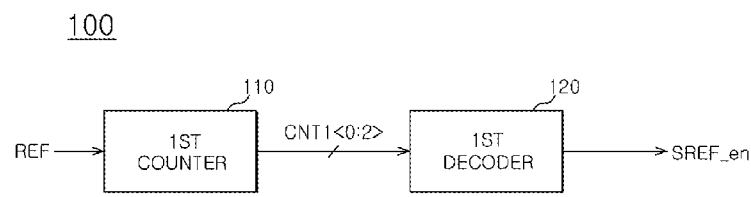
FIG. 2 is a block diagram representation of an embodiment of a refresh counting portion as illustrated in FIG. 1.

Referring to FIG. 2, the refresh counting portion 100 may include a first counter 110 and a first decoder 120.

The first counter 110 may count a first counter signal CNT1<0:2> whenever the refresh signal REF is enabled. The first counter 110 may count the number of times the refresh signal REF is received by the first counter 110, and generate a first counter signal CNT1<0:2> in response to the number of refresh signals received. For example, the first counter 110 may count the first counter signal CNT1<0:2> whenever the refresh signal REF is transitioned to a high level (i.e., high voltage logic level or high voltage level).

The first decoder 120 may enable the smart refresh enable signal SREF_en when the first counter signal CNT1<0:2> has a predetermined value. For example, the first decoder 120 may enable the smart refresh enable signal SREF_en when the first counter signal CNT1<0:2> has a value of (1, 1, 1), etc.

Figure 3:
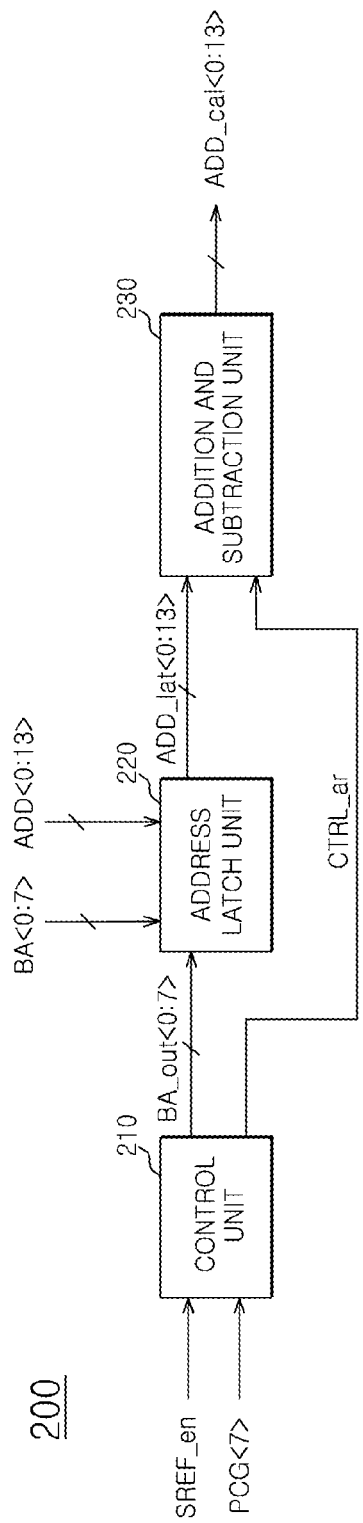
FIG. 3 is a block diagram representation of an embodiment of an address arithmetic portion illustrated in FIG. 1.

Referring to FIG. 3, the address arithmetic portion 200 may include a control unit 210 and an address latch unit 220. The address arithmetic portion 200 may also include an addition and subtraction unit 230.

The control unit 210 may generate a bank address output signal BA_out<0:7>. When the smart refresh enable signal SREF_en is enabled, the control unit 210 may generate the bank address output signal BA_out<0:7>. When a last bank precharge signal PCG<7> is enabled, the control unit 210 may quit generating the bank address output signal BA_out<0:7>. The last bank precharge signal PCG<7> may be a precharge signal associated with the last bank or, for example, a seventh bank in 8 numbers of banks when the semiconductor memory apparatus includes 8 numbers of banks having first to eighth banks. Also, in response to the smart refresh enable signal SREF_en and the last bank precharge signal PCG<7>, the control unit 210 may generate an addition and subtraction control signal CTRL_ar. For example, the control unit 210 may enable the addition and subtraction control signal CTRL_ar when the smart refresh enable signal SREF_en is disabled. For example, the control unit 210 may disable the addition and subtraction control signal CTRL_ar when the smart refresh enable signal SREF_en is enabled and the last bank precharge signal PCG<7> is enabled.

The address latch unit 220 may latch the address ADD<0:13> according to a bank address BA<0:7>. The address latch unit 220 may output the latched address ADD<0:13> as a latch address ADD_lat<0:13>. For example, the semiconductor memory apparatus may include the 8 banks of first to eighth banks, and each of the 8 banks may be activated according to the bank address BA<0:7> corresponding to one of the banks. That is, the first bank may be activated and the address ADD<0:13> corresponding with the first bank may be latched when the first bank address BA<0> is activated. In more detail, the address latch unit 220 may latch and output 8 numbers of the addresses ADD<0:13>, which may correspond to the bank addresses BA<0:7>, respectively, according to the bank addresses BA<0:7>.

The addition and subtraction unit 230 may perform the arithmetic operation of addition or subtraction on the latch address ADD_lat<0:13>. The addition and subtraction unit 230 may output the latch address ADD_lat<0:13>, on which the arithmetic operation of addition or subtraction is performed, as the arithmetic address ADD_cal<0:13> in response to the addition and subtraction control signal CTRL_ar. For example, the addition and subtraction unit 230 may add one (+1) to the latch address ADD_lat<0:13>. When the addition and subtraction control signal CTRL_ar is enabled, addition and subtraction unit 230 may output the result of the addition as the arithmetic address ADD_cal<0:13>. Also, the addition and subtraction unit 230 may subtract one (−1) from the latch address ADD_lat<0:13>. When the addition and subtraction control signal CTRL_ar is disabled, the addition and subtraction unit 230 may output the result of subtraction as the arithmetic address ADD_cal<0:13>.

Figure 4:
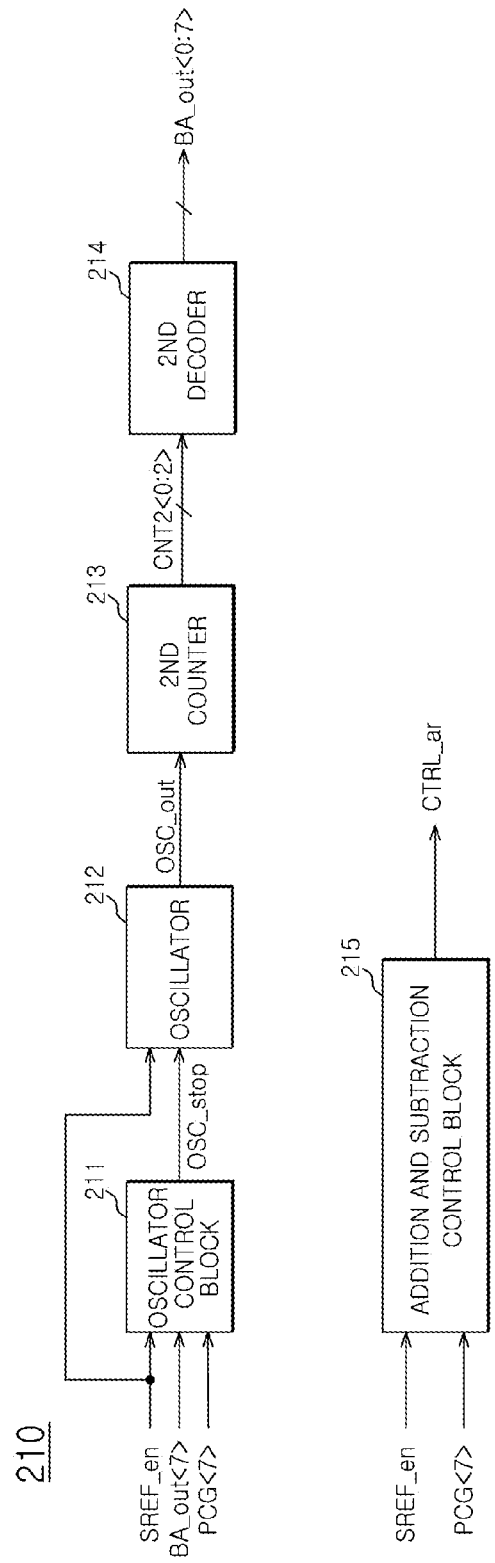
FIG. 4 is a block diagram representation of an embodiment of a control unit illustrated in FIG. 3.

Referring to FIG. 4, the control unit 210 may include an oscillator control block 211, an oscillator 212, and a second counter 213. The control unit 210 may also include a second decoder 214 and an addition and subtraction control block 215.

When the smart refresh enable signal SREF_en is enabled and a last bank address output signal BA_out<7> of the bank address output signal BA_out<0:7> is enabled, the oscillator control block 211 may then enable an oscillator stop signal OSC_stop. Also, when the last bank precharge signal PCG<7> is enabled, the oscillator control block 211 may disable the oscillator stop signal OSC_stop.

When the smart refresh enable signal SREF_en is enabled, the oscillator 212 may generate an oscillator output signal OSC_out by performing an oscillating operation. When the oscillator stop signal OSC_stop is enabled, the oscillator 212 may quit performing the oscillating operation and may quit generating the oscillator output signal OSC_out.

The second counter 213 may generate a second count signal CNT2<0:2> by counting the oscillator output signal OSC_out. For example, whenever the oscillator output signal OSC_out transitions to a predetermined level, the second counter 213 may up-count the second count signal CNT2<0:2>.

The second decoder 214 may generate the bank address output signal BA_out<0:7> by decoding the second count signal CNT2<0:2>. For example, the second decoder 214 may enable a first bank address output signal BA_out<0> of the bank address output signal BA_out<0:7> when the value of the second count signal CNT2<0:2> becomes (0, 0, 0). For example, the second decoder 214 may enable a second bank address output signal BA_out<1> of the bank address output signal BA_out<0:7> when the value of the second count signal CNT2<0:2> becomes (0, 0, 1). For example, the second decoder 214 may enable a third bank address output signal BA_out<2> of the bank address output signal BA_out<0:7> when the value of the second count signal CNT2<0:2> becomes (0, 1, 0). For example, the second decoder 214 may enable a fourth bank address output signal BA_out<3> of the bank address output signal BA_out<0:7> when the value of the second count signal CNT2<0:2> becomes (0, 1, 1). For example, the second decoder 214 may enable a fifth bank address output signal BA_out<4> of the bank address output signal BA_out<0:7> when the value of the second count signal CNT2<0:2> becomes (1, 0, 0). For example, the second decoder 214 may enable a sixth bank address output signal BA_out<5> of the bank address output signal BA_out<0:7> when the value of the second count signal CNT2<0:2> becomes (1, 0, 1). For example, the second decoder 214 may enable a seventh bank address output signal BA_out<6> of the bank address output signal BA_out<0:7> when the value of the second count signal CNT2<0:2> becomes (1, 1, 0). Finally, for example, the second decoder 214 may enable the last or an eighth bank address output signal BA_out<7> of the bank address output signal BA_out<0:7> when the value of the second count signal CNT2<0:2> becomes (1, 1, 1).

When the smart refresh enable signal SREF_en is disabled, the addition and subtraction control block 215 may enable the addition and subtraction control signal CTRL_ar. When the smart refresh enable signal SREF_en is enabled and the last bank precharge signal PCG<7> is enabled, the addition and subtraction control block 215 may disable the addition and subtraction control signal CTRL_ar.

Figure 5:
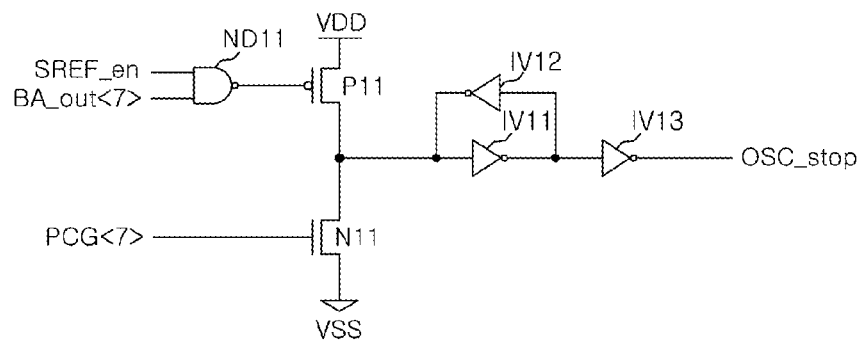
FIG. 5 is a circuit diagram representation of an embodiment of an oscillator control block illustrated in FIG. 4.

Referring to FIG. 5, the oscillator control block 211 may include a NAND gate ND11 and first and second transistors P11 and N11. The oscillator control block 211 may also include first to third inverters IV11 to IV13. The NAND gate ND11 may receive the smart refresh enable signal SREF_en and the last bank address output signal BA_out<7>. At the gate terminal of the first transistor P11 an output signal of the NAND gate ND11 may be received. An external voltage VDD may be received at the source terminal of the first transistor P11. At the gate terminal of the second transistor N11 a last bank precharge signal PCG<7> may be received. The drain terminal of the second transistor N11 may be coupled to a drain terminal of the first transistor P11. The source terminal of the second transistor may be couple to a ground VSS. The input terminal of the first inverter IV11 may be coupled to the drain terminals of the first and second transistors P11 and N11. The input terminal of the second inverter IV12 may be coupled to an output terminal of the first inverter IV11. The output terminal of the second inverter IV12 may be coupled to the input terminal of the first inverter IV11. The input terminal of the third inverter IV13 may be coupled to the output terminal of the first inverter IV11. The input terminal of the third inverter IV13 may be coupled to the input terminal of the second inverter IV12. The output terminal of the third inverter IV13 may output the oscillator stop signal OSC_stop.

Figure 6:
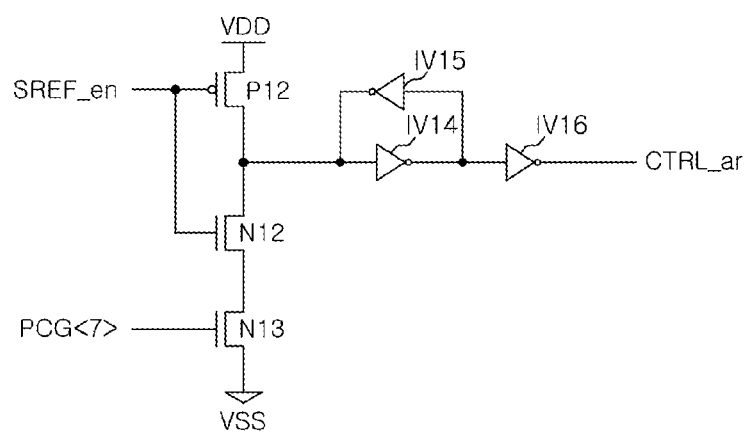
FIG. 6 is a circuit diagram representation of an embodiment of an addition and subtraction control block illustrated in FIG. 4.

Referring to FIG. 6, the addition and subtraction control block 215 may include third to fifth transistors P12, N12, and N13, and fourth to sixth inverters IV14, IV15, and IV16.

The gate terminal of the third transistor P12 may receive the smart refresh enable signal SREF_en. The source terminal of the third transistor P12 may receive the external voltage VDD. The gate terminal of the fourth transistor N12 may receive the smart refresh enable signal SREF_en. The drain terminal of the fourth transistor N12 may be coupled to the drain terminal of the third transistor P12. The gate terminal of the fifth transistor N13 may receive the last bank precharge signal PCG<7>. The drain terminal of the fifth transistor N13 may be coupled to a source terminal of the fourth transistor N12. The source terminal of the fifth transistor N13 may be coupled to the ground VSS. The input terminal of the fourth inverter IV14 may be coupled to the drain terminals of the third transistor P12 and the fourth transistor N12. The input terminal of the fifth inverter IV15 may be coupled to an output terminal of the fourth inverter IV14. The output terminal of the fifth inverter IV15 may be coupled to the input terminal of the fourth inverter IV14. The input terminal of the sixth inverter IV16 may be coupled to the output terminal of the fourth inverter IV14. The output terminal of the sixth inverter IV16 may output the addition and subtraction control signal CTRL_a r.

Figure 7:
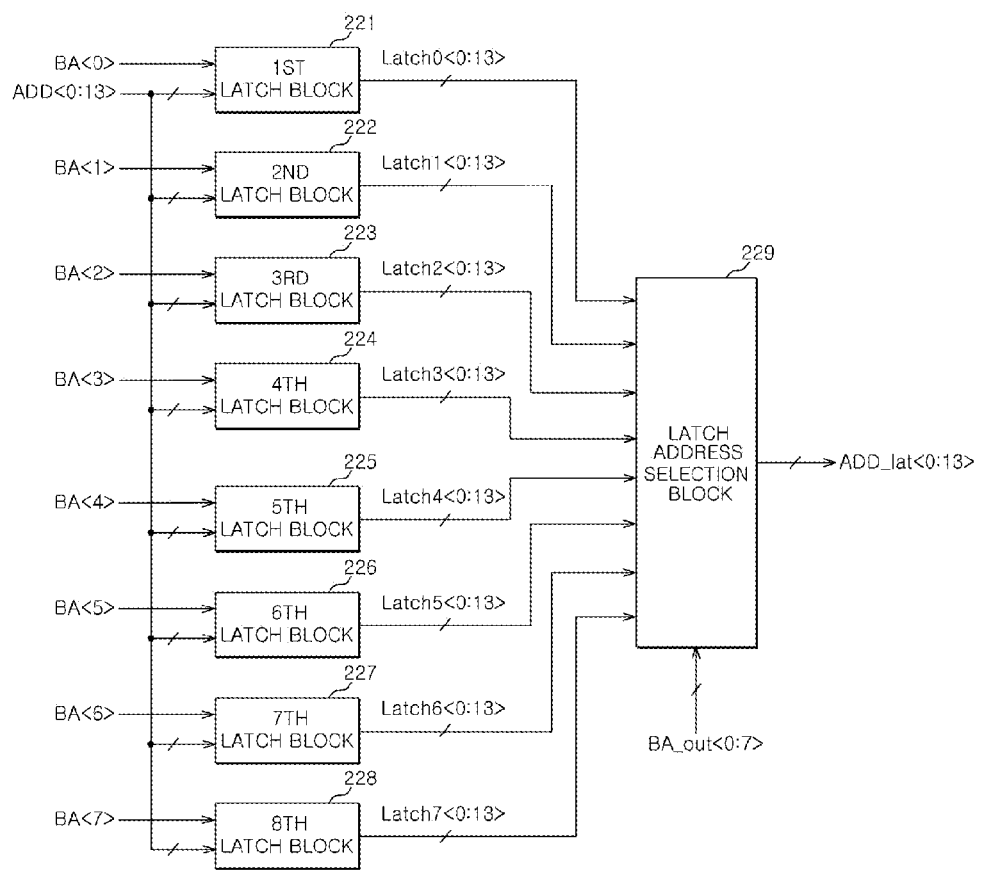
FIG. 7 is a block diagram representation of an embodiment of an address latch unit illustrated in FIG. 3.

Referring to FIG. 7, the address latch unit 220 may include first to eighth latch blocks 221 to 228 and a latch address selection block 229.

When a first bank address BA<0> of the bank address BA<0:7> is activated, the first latch block 221 may latch the address ADD<0:13> and output the latched address ADD<0:13> as a first latch signal Latch0<0:13>.

When a second bank address BA<1> of the bank address BA<0:7> is activated, the second latch block 222 may latch the address ADD<0:13> and output the latched address ADD<0:13> as a second latch signal Latch1<0:13>.

When a third bank address BA<2> of the bank address BA<0:7> is activated, the third latch block 223 may latch the address ADD<0:13> and output the latched address ADD<0:13> as a third latch signal Latch2<0:13>.

When a fourth bank address BA<3> of the bank address BA<0:7> is activated, the fourth latch block 224 may latch the address ADD<0:13> and output the latched address ADD<0:13> as a fourth latch signal Latch3<0:13>.

When a fifth bank address BA<4> of the bank address BA<0:7> is activated, the fifth latch block 225 may latch the address ADD<0:13> and output the latched address ADD<0:13> as a fifth latch signal Latch4<0:13>.

When a sixth bank address BA<5> of the bank address BA<0:7> is activated, the sixth latch block 226 may latch the address ADD<0:13> and output the latched address ADD<0:13> as a sixth latch signal Latch5<0:13>.

When a seventh bank address BA<6> of the bank address BA<0:7> is activated, the seventh latch block 227 may latch the address ADD<0:13> and output the latched address ADD<0:13> as a seventh latch signal Latch6<0:13>.

When an eighth bank address BA<7> of the bank address BA<0:7> is activated, the eighth latch block 228 may latch the address ADD<0:13> and output the latched address ADD<0:13> as a eighth latch signal Latch7<0:13>.

In summary, each of the first to eighth latch blocks 221 to 228 of the address latch unit 220, which correspond to the bank addresses BA<0:7>, respectively, may latch the addresses ADD<0:13> when a corresponding one BA<i> of the bank address BA<0:7> is activated.

In general, the latch address selection block 229 may output one of the first to eighth latch signals Latch0<0:13> to Latch7<0:13> as the latch address ADD_lat<0:13> in response to the bank address output signal BA_out<0:7>. For example, the latch address selection block 229 may output the first latch signal Latch0<0:13> as the latch address ADD_lat<0:13> when a first bank address output signal BA_out<O> of the bank address output signal BA_out<0:7> is activated. For example, the latch address selection block 229 may output the second latch signal Latch1<0:13> as the latch address ADD_lat<0:13> when a second bank address output signal BA_out<1> of the bank address output signal BA_out<0:7> is activated. For example, the latch address selection block 229 may output the third latch signal Latch2<0:13> as the latch address ADD_lat<0:13> when a third bank address output signal BA_out<2> of the bank address output signal BA_out<0:7> is activated. For example, the latch address selection block 229 may output the fourth latch signal Latch3<0:13> as the latch address ADD_lat<0:13> when a fourth bank address output signal BA_out<3> of the bank address output signal BA_out<0:7> is activated. For example, the latch address selection block 229 may output the fifth latch signal Latch4<0:13> as the latch address ADD_lat<0:13> when a fifth bank address output signal BA_out<4> of the bank address output signal BA_out<0:7> is activated. For example, the latch address selection block 229 may output the sixth latch signal Latch5<0:13> as the latch address ADD_lat<0:13> when a sixth bank address output signal BA_out<5> of the bank address output signal BA_out<0:7> is activated. For example, the latch address selection block 229 may output the seventh latch signal Latch6<0:13> as the latch address ADD_lat<0:13> when a seventh bank address output signal BA_out<6> of the bank address output signal BA_out<0:7> is activated. For example, the latch address selection block 229 may output the eighth latch signal Latch7<0:13> as the latch address ADD_lat<0:13> when a eighth bank address output signal BA_out<7> of the bank address output signal BA_out<0:7> is activated.

Operation of the semiconductor memory apparatus will be described hereinafter.

It may be assumed, for example purposes only, that the semiconductor memory apparatus in accordance with an embodiment may include 8 banks. However, any number of banks may be used in accordance with the semiconductor memory apparatus and as such in other embodiments more or less banks may be implemented than what is used for these embodiments below.

A refresh command or a refresh signal may be inputted to the semiconductor memory apparatus from a controller.

In accordance with an embodiment, when the input number of the refresh signal REF reaches a predetermined number, the semiconductor memory apparatus may activate and perform a refresh operation to an adjacent word line, which is adjacent to a frequently activated word line, by outputting the selection address ADD_sel<0:13>, on which the arithmetic operation of addition is performed, and after that, by outputting the selection address ADD_sel<0:13>, on which the arithmetic operation of subtraction is performed.

Operation of the semiconductor memory apparatus will be described in detail hereinafter with reference to the accompanying figures.

Referring to FIG. 1, the semiconductor memory apparatus in accordance with an embodiment may include the refresh counting portion 100 and the address arithmetic portion 200. The semiconductor memory apparatus may also include the address selection portion 300.

When the input number of the refresh signal REF reaches a predetermined number, the refresh counting portion 100 may enable the smart refresh enable signal SREF_en. Referring to FIG. 2, the refresh counting portion 100 may include the first counter 110. The first counter 110 may up-count the first counter signal CNT1<0:2> whenever the activated refresh signal REF is inputted. The first decoder 120 may decode the first counter signal CNT1<0:2> and enable the smart refresh enable signal SREF_en. It may be assumed, for example, that the refresh counting portion 100 enables the smart refresh enable signal SREF_en when the refresh signal REF is inputted 8 times. The first counter 110 may increase a value of the first counter signal CNT1<0:2> whenever the activated refresh signal REF is inputted. The first decoder 120 may enable the smart refresh enable signal SREF_en when the value of the first counter signal CNT1<0:2> reaches (1, 1, 1) from (0, 0, 0).

The address arithmetic portion 200 illustrated in FIG. 1 may latch the address ADD<0:13> in response to the bank address BA<0:7>, and perform the arithmetic operation of addition and subtraction on the latched address ADD<0:13>, and output the latched address ADD<0:13>, on which the arithmetic operation of addition and subtraction is performed, as the arithmetic address ADD_cal<0:13> in response to the smart refresh enable signal SREF_en.

Referring to FIG. 3, the operation of the address arithmetic portion 200 will be described below in detail.

The address arithmetic portion 200 may include the control unit 210 and the address latch unit 220. The address arithmetic portion 200 may also include the addition and subtraction unit 230.

The control unit 210 may generate the bank address output signal BA_out<0:7> and the addition and subtraction control signal CTRL_ar in response to the smart refresh enable signal SREF_en and the last bank precharge signal PCG<7>.

Referring to FIG. 4, the operation of the control unit 210 will be described below in detail.

The control unit 210 may include the oscillator control block 211, the oscillator 212, and the second counter 213. The control unit 210 may also include the second decoder 214 and the addition and subtraction control block 215.

The oscillator control block 211 may enable the oscillator stop signal OSC_stop when the smart refresh enable signal SREF_en is enabled and the last bank address output signal BA_out<7> of the bank address output signal BA_out<0:7> is enabled. Also, when the last bank precharge signal PCG<7> is enabled, the oscillator control block 211 may disable the oscillator stop signal OSC_stop.

The oscillator 212 may generate the oscillator output signal OSC_out, which may be periodically transitioned, when the smart refresh enable signal SREF_en is enabled. Also, when the oscillator stop signal OSC_stop is activated, the oscillator 212 may hold the oscillator output signal OSC_out at a predetermined level. That is, when the oscillator stop signal OSC_stop is activated, the oscillator 212 may quit generating the oscillator output signal OSC_out.

Whenever the oscillator output signal OSC_out transitions to a predetermined level, the second counter 213 may up-count the second count signal CNT2<0:2>. For example, whenever the oscillator output signal OSC_out transitions to a high level, the second counter 213 may increase a value of the second count signal CNT2<0:2>.

The second decoder 214 may generate the bank address output signal BA_out<0:7> by decoding the second count signal CNT2<0:2>. The second decoder 214 may generate the bank address output signal BA_out<0:7> having a value corresponding to a value of the second count signal CNT2<0:2>. That is, the second decoder 214 may activate one bank address output signal BA_out<i> of the bank address output signal BA_out<0:7> according to the value of the second count signal CNT2<0:2>.

The addition and subtraction control block 215 may enable the addition and subtraction control signal CTRL_ar when the smart refresh enable signal SREF_en is disabled, and may disable the addition and subtraction control signal CTRL_ar when the last bank precharge signal PCG<7> is enabled during enablement of the smart refresh enable signal SREF_en.

In summary, operation of the control unit 210 is as follows.

When the smart refresh enable signal SREF_en is activated or enabled, the control unit 210 may sequentially activate or enable the bank address output signal BA_out<0:7> by counting the oscillator output signal OSC_out. Also, when the last bank address output signal BA_out<7> is enabled from the bank address output signal BA_out<0:7>, which is sequentially enabled, during enablement of the smart refresh enable signal SREF_en, the control unit 210 may enable the oscillator stop signal OSC_stop, hold the oscillator output signal OSC_out at a predetermined level, and quit sequentially enabling the bank address output signal BA_out<0:7>, which is being sequentially enabled. When the last bank precharge signal PCG<7> is enabled, the control unit 210 may deactivate or disable the oscillator stop signal OSC_stop, and the oscillator output signal OSC_out, which is currently held at the predetermined level, may be periodically transitioned. When the oscillator output signal OSC_out is periodically transitioned, the control unit 210 may sequentially enable the bank address output signal BA_out<0:7> again.

When the smart refresh enable signal SREF_en is disabled, the control unit 210 may enable the addition and subtraction control signal CTRL_ar. When the last bank precharge signal PCG<7> is activated during activation of the smart refresh enable signal SREF_en, the control unit 210 may disable the addition and subtraction control signal CTRL_ar.

Referring to FIG. 7, the address latch unit 220 illustrated in FIG. 3 may include the first to eighth latch blocks 221 to 228, and may latch the address ADD<0:13> in the first to eighth latch blocks 221 to 228, which are corresponding to the bank address BA<0:7>, respectively. The address latch unit 220 may output one of the latched signals (the first to eighth latch signals Latch0<0:13> to Latch7<0:13>) as the latch address ADD_lat<0:13> in response to the bank address output signal BA_out<0:7>.

When the addition and subtraction control signal CTRL_ar is enabled, the addition and subtraction unit 230 illustrated in FIG. 3 may add one (+1) to the latch address ADD_lat<0:13> and output the result of addition as the arithmetic address ADD_cal<0:13>. Also, when the addition and subtraction control signal CTRL_ar is disabled, the addition and subtraction unit 230 may subtract one (−1) from the latch address ADD_lat<0:13> and output the result of subtraction as the arithmetic address ADD_cal<0:13>. For example, it is assumed that the value of the latch address ADD_lat<0:13> is (0, 0, 0, 0, 0, 0, 0, 0, 0, 1, 1, 1, 1, 1). The addition and subtraction unit 230 may add 1 to the latch address ADD_lat<0:13> and generate the arithmetic address ADD_cal<0:13> having a value of (0, 0, 0, 0, 0, 0, 0, 0, 1, 0, 0, 0, 0, 0) when the addition and subtraction control signal CTRL_ar is enabled. Also, the addition and subtraction unit 230 may subtract 1 from the latch address ADD_lat<0:13> and generate the arithmetic address ADD_cal<0:13> having a value of (0, 0, 0, 0, 0, 0, 0, 0, 1, 1, 1, 1, 0) when the addition and subtraction control signal CTRL_ar is disabled.

In summary, operation of the address arithmetic portion 200 illustrated in FIG. 1 is as follows. Each of the first to eighth latch blocks 221 to 228 of the address latch unit 220, which are corresponding to the bank address BA<0:7>, respectively, may latch the address ADD<0:13>, and generate the first to eighth latch signals Latch0<0:13> to Latch7<0:13> in response to the bank address BA<0:7>. When the smart refresh enable signal SREF_en is enabled, the control unit 210 may sequentially enable the bank address output signal BA_out<0:7>, and accordingly the address latch unit 220 may sequentially output the first to eighth latch signals Latch0<0:13> to Latch7<0:13> as the latch address ADD_lat<0:13>. During enablement of the addition and subtraction control signal CTRL_ar, the addition and subtraction unit 230 may perform the arithmetic operation of addition on the latch address ADD_lat<0:13>, and output the latch address ADD_lat<0:13>, on which the arithmetic operation of addition is performed, as the arithmetic address ADD_cal<0:13>. Also, during disablement of the addition and subtraction control signal CTRL_ar, the addition and subtraction unit 230 may perform the arithmetic operation of subtraction on the latch address ADD_lat<0:13>, and output the latch address ADD_lat<0:13>, on which the arithmetic operation of subtraction is performed, as the arithmetic address ADD_cal<0:13>.

The address selection portion 300 illustrated in FIG. 1 may output the address ADD<0:13> as the selection address ADD_sel<0:13> when the smart refresh enable signal SREF_en is disabled. When the smart refresh enable signal SREF_en is enabled, the address selection portion 300 may output the arithmetic address ADD_cal<0:13> as the selection address ADD_sel<0:13>.

In summary again, operation of the semiconductor memory apparatus is as follows.

It may be assumed, for example purposes only, that the semiconductor memory apparatus in accordance with an embodiment may include 8 banks. However, the scope of these embodiments are not limited to a semiconductor memory apparatus having 8 banks even though the assumption that the semiconductor memory apparatus in accordance with an embodiment includes 8 banks. Any number of banks may be used in accordance with the semiconductor memory apparatuses and as such in other embodiments more or less banks may be implemented than what is used for these embodiments below.

A refresh command or the refresh signal REF may be input to the semiconductor memory apparatus from a controller. The refresh signal REF may be input to the semiconductor memory apparatus a predetermined number of times. For example, the refresh signal REF may be input to the semiconductor memory apparatus 8 times.

The refresh counting portion 100 may count the number of times the refresh signal REF is input, and enable the smart refresh enable signal SREF_en when the number of times the refresh signal REF is input reaches a predetermined number.

The address arithmetic portion 200 may latch the address ADD<0:13>, which is inputted to the 8 banks. For example, the address arithmetic portion 200 may latch 8 of the addresses ADD<0:13>, which may correspond to the bank addresses BA<0:7>, respectively. Each bank address BA<i> of the bank address BA<0:7> correspond to each of the 8 banks. In more detail, the address arithmetic portion 200 may latch the address ADD<0:13> corresponding to a first bank of the 8 banks when the first bank address BA<0> of the bank address BA<0:7> is enabled. The address arithmetic portion 200 may latch the address ADD<0:13> corresponding to a second bank of the 8 banks when the second bank address BA<1> of the bank address BA<0:7> is enabled. In this way, the address arithmetic portion 200 may latch the 8 addresses ADD<0:13>, which may correspond to the 8 banks, respectively. Also, the address arithmetic portion 200 may perform the arithmetic operation of addition (+1) on each of the 8 latched addresses ADD<0:13>, and sequentially output the 8 latched addresses ADD<0:13>, on which the arithmetic operations of addition are performed, as the arithmetic addresses ADD_cal<0:13>. After sequentially outputting the 8 latched addresses ADD<0:13>, on which the arithmetic operations of addition are performed, as the arithmetic addresses ADD_cal<0:13>, the address arithmetic portion 200 may perform the arithmetic operation of subtraction (−1) on each of the 8 latched addresses ADD<0:13>, and sequentially output the 8 latched addresses ADD<0:13>, on which the arithmetic operations of subtraction are performed, as the arithmetic addresses ADD_cal<0:13>.

The address selection portion 300 may output the arithmetic address ADD_cal<0:13> as the selection address ADD_sel<0:13> when the smart refresh enable signal SREF_en is enabled. The address selection portion 300 may output the address ADD<0:13> as the selection address ADD_sel<0:13> when the smart refresh enable signal SREF_en is disabled.

As disclosed above, in accordance with an embodiment, when the refresh operation is performed frequently, or the input number of the refresh signal reaches a predetermined number, the semiconductor memory apparatus may perform the arithmetic operation of addition (+1) and subtraction (−1) on the address, on which the last refresh operation is performed in each bank, and may perform a refresh operation on the address, on which the arithmetic operation of addition and subtraction is performed. In more detail, when the refresh operation is performed frequently, the semiconductor memory apparatus may activate again and perform a refresh operation to the adjacent word line, which is adjacent to the word line, on which the last refresh operation is performed in each bank. Therefore, in accordance with an embodiment, the semiconductor memory apparatus may prevent damage to the data by performing the refresh operation on the memory cells coupled to the adjacent word lines of the frequently activated word lines even though the integrity of the semiconductor memory apparatus becomes higher and distances between signal lines and between memory cells of the semiconductor memory apparatus become narrower.

Figure 8:
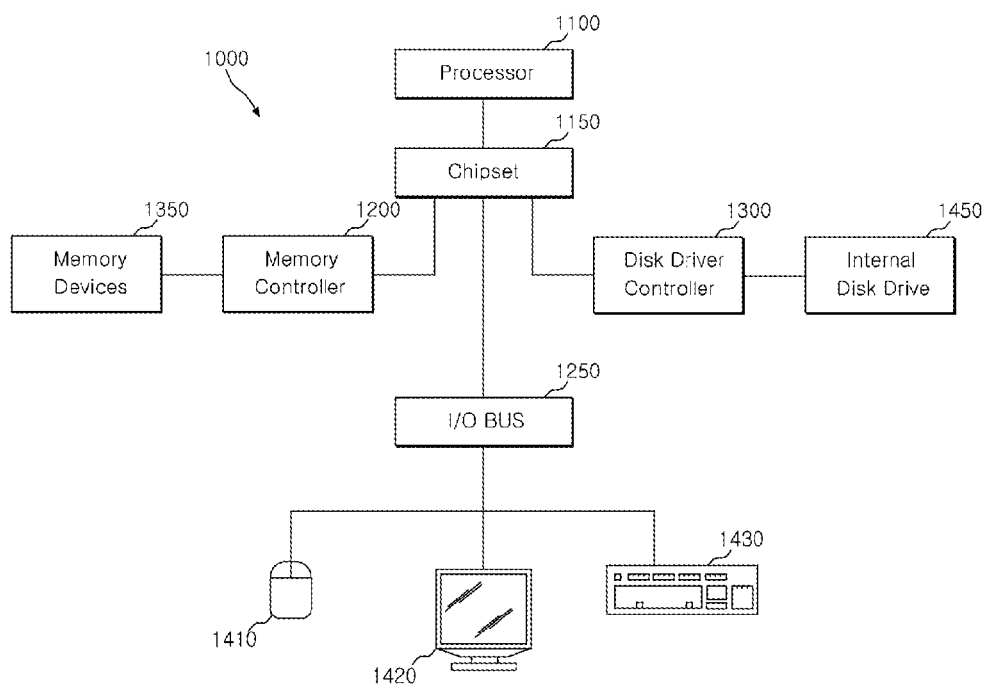
FIG. 8 illustrates a block diagram representation of an ex-ample of a system employing the semiconductor memory apparatus in accordance with the embodiments discussed above with relation to FIGS. 1-7.

The semiconductor memory apparatus discussed above is particular useful in the design of memory devices, processors, and computer systems. For example, referring to FIG. 8, a block diagram of a system employing the semiconductor memory apparatus in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor memory apparatus as discussed above with reference to FIGS. 1-7. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor memory apparatus as discussed above with relation to FIGS. 1-7, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 8 is merely one example of a system employing the semiconductor memory apparatus as discussed above with relation to FIGS. 1-7. In alternate embodiments, such as cellular phones or digital cameras, the components may differ from the embodiments illustrated in FIG. 8.

While various embodiments have been described above, it will be understood to those skilled in the art that the embodiments described are by way of example only. Accordingly, the semiconductor memory apparatus should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
   a refresh counting portion configured to count the number of times a refresh signal is received by the refresh counting portion, and configured to generate a smart refresh enable signal when the number of times the refresh signal is received by the refresh counting portion reaches a predetermined number;
   an address arithmetic portion configured to latch an address, and, when the smart refresh enable signal is enabled, configured to perform an arithmetic operation of addition and subtraction on the latched address and output a result of the arithmetic operation as an arithmetic address; and
   an address selection portion configured to output one of the arithmetic addresses and one of the addresses as a selection address in response to the smart refresh enable signal.

2. The semiconductor memory apparatus of claim 1, wherein the refresh counting portion comprises:
   a counter configured to count the number of times the refresh signal is received and configured to generate a first counter signal in response to the number of the refresh signals received; and
   a decoder configured to generate the smart refresh enable signal when the first counter signal has a predetermined value.

3. The semiconductor memory apparatus of claim 1, wherein the address arithmetic portion comprises:
   a control unit configured to generate a bank address output signal, and an addition and subtraction control signal in response to the smart refresh enable signal;
   an address latch unit configured to latch the address, and output the latched address as a latch address in response to the bank address output signal; and
   an addition and subtraction unit configured to perform the arithmetic operation of addition or subtraction on the latch address, and output the latch address, on which the arithmetic operation of addition or subtraction is performed, as the arithmetic address in response to the addition and subtraction control signal.

4. The semiconductor memory apparatus of claim 3, wherein the addition and subtraction unit generates the arithmetic address by performing the arithmetic operation of addition on the latch address when the addition and subtraction control signal is enabled, and generates the arithmetic address by performing the arithmetic operation of subtraction on the latch address when the addition and subtraction control signal is disabled.

5. The semiconductor memory apparatus of claim 1, wherein the address selection portion outputs the arithmetic address as the selection address when the smart refresh enable signal is enabled, and outputs the address as the selection address when the smart refresh enable signal is disabled.

6. The semiconductor memory apparatus of claim 1, wherein the address includes an address of a row.

7. A semiconductor memory apparatus comprising:
 a refresh counting portion configured to enable a smart refresh enable signal when a refresh signal is enabled a predetermined number of times;
 an address arithmetic portion configured to respectively latch an address according to a bank address, and, in response to the smart refresh enable signal, configured to perform an arithmetic operation of addition and subtraction on the latched address and sequentially output a result of the arithmetic operation as an arithmetic address; and
 an address selection portion configured to output one of the arithmetic addresses and one of the addresses as a selection address in response to the smart refresh enable signal.

8. The semiconductor memory apparatus of claim 7, wherein the refresh counting portion comprises:
 a counter configured to increase a value of a first counter signal whenever the refresh signal is enabled; and
 a decoder configured to enable the smart refresh enable signal when the value of the first counter signal is a predetermined value.

9. The semiconductor memory apparatus of claim 7, wherein the address arithmetic portion comprises:
 a control unit configured to generate a bank address output signal, and an addition and subtraction control signal in response to the smart refresh enable signal and a predetermined bank precharge signal;
 an address latch unit configured to latch the address in response to the bank address, and output the latched address as a latch address in response to the bank address output signal; and
 an addition and subtraction unit configured to perform the arithmetic operation of addition or subtraction on the latch address, and output the latch address, on which the arithmetic operation of addition or subtraction is performed, as the arithmetic address in response to the addition and subtraction control signal.

10. The semiconductor memory apparatus of claim 9, wherein the bank address output signal includes a plurality of bank address output signals, and
 wherein the predetermined bank precharge signal precharges a last bank of a plurality of banks included in the semiconductor memory apparatus.

11. The semiconductor memory apparatus of claim 10, wherein the control unit comprises:
 an oscillator control block configured to enable an oscillator stop signal in response to the smart refresh enable signal and the bank address output signal corresponding to the last bank, and disable the oscillator stop signal in response to the predetermined bank precharge signal;
 an oscillator configured to generate an oscillator output signal when the smart refresh enable signal is enabled, and configured to stop generating the oscillator output signal when the oscillator stop signal is enabled;
 a counter configured to generate a counter signal by counting the oscillator output signal;
 a decoder configured to sequentially enable the plurality of bank address output signals by decoding the counter signal; and
 an addition and subtraction control block configured to enable an addition and subtraction control signal until all of the smart refresh enable signals and the predetermined bank precharge signals are enabled, and disable the addition and subtraction control signal when all of the smart refresh enable signals and the predetermined bank precharge signals are enabled.

12. The semiconductor memory apparatus of claim 11, wherein the bank address includes a plurality of bank addresses,
 wherein the address latch unit comprises a plurality of latch blocks, and
 wherein each of the plurality of latch blocks latches the address when corresponding bank address of the plurality of bank addresses is enabled, and outputs the latched address as the latch address when corresponding bank address output signal of the plurality of bank address output signals is enabled.

13. The semiconductor memory apparatus of claim 12, wherein the address latch unit further comprises a latch address selection block configured to output one of the outputs of the plurality of latch blocks as the latch address in response to the plurality of bank address output signals.

14. The semiconductor memory apparatus of claim 9, wherein when the addition and subtraction control signal is enabled, the addition and subtraction unit performs the arithmetic operation of addition on the latch address, and outputs the latch address, on which the arithmetic operation of addition is performed, as the arithmetic address, and when the addition and subtraction control signal is disabled, the addition and subtraction unit performs the arithmetic operation of subtraction on the latch address, and outputs the latch address, on which the arithmetic operation of subtraction is performed, as the arithmetic address.

\* \* \* \* \*